United States Patent
Kamath et al.

(10) Patent No.: US 12,532,777 B2
(45) Date of Patent: Jan. 20, 2026

(54) SEMICONDUCTOR DEVICE PACKAGE WITH COUPLED SUBSTRATES

(71) Applicant: SANDISK TECHNOLOGIES, INC., Milpitas, CA (US)

(72) Inventors: Rohith Kamath, Bangalore (IN); Amit Vijayvargiya, Bangalore (IN); Shankara Venkatraman Gopalan, Bangalore (IN); Shankar AB, Bengaluru (IN)

(73) Assignee: SANDISK TECHNOLOGIES, INC., Milpitas, CA (US)

( * ) Notice: Subject to any disclaimer, the term of this patent is extended or adjusted under 35 U.S.C. 154(b) by 931 days.

(21) Appl. No.: 17/737,618

(22) Filed: May 5, 2022

(65) Prior Publication Data

US 2023/0361093 A1 Nov. 9, 2023

(51) Int. Cl.
*H01L 25/16* (2023.01)
*H01L 23/498* (2006.01)
*H01L 23/64* (2006.01)

(52) U.S. Cl.
CPC ...... *H01L 25/162* (2013.01); *H01L 23/49811* (2013.01); *H01L 23/49827* (2013.01); *H01L 23/642* (2013.01); *H01L 25/165* (2013.01); *H01L 23/49838* (2013.01)

(58) Field of Classification Search
CPC ............... H05K 1/142; H05K 1/181; H05K 2201/10015; H05K 2201/10628; H05K 2201/09063; H05K 2201/10189; H05K 2201/10651
See application file for complete search history.

(56) References Cited

U.S. PATENT DOCUMENTS

2019/0355515 A1* 11/2019 Li ..................... H01G 4/385
2021/0045247 A1* 2/2021 Hung ................. H05K 1/142

FOREIGN PATENT DOCUMENTS

WO     WO-03092343 A1 * 11/2003 ........... H01R 12/721

OTHER PUBLICATIONS

WO 03092343 A1 Translation (Year: 2025).*
SNIA Solid State Drive Form Factors [online]. Available at least as early as Feb. 2022 [retrieved on May 4, 2022]. Retrieved from the Internet: <https://www.snia.org/forums/cmsi/knowledge/formfactors#EDSFF>, 8 pages.

(Continued)

*Primary Examiner* — Timothy J Thompson
*Assistant Examiner* — John B Freal
(74) *Attorney, Agent, or Firm* — Morgan, Lewis & Bockius LLP

(57) ABSTRACT

A semiconductor device package includes a first substrate extending along a first central plane, and a second substrate electrically connected to the first substrate and extending along a second central plane that is substantially parallel with and offset from the first central plane of the first substrate. One or more capacitors are electrically and mechanically connected to the second substrate via one or more leads. All of the one or more capacitors are positioned at the second substrate. All of the capacitors being positioned at the second substrate, reduces the complexity of and time required to manufacture the semiconductor device package.

20 Claims, 8 Drawing Sheets

(56) References Cited

OTHER PUBLICATIONS

SNIA Next Gen Performance and Efficiency wit EDSFF SSD. Available at least as early as Sep. 23, 2019, [retrieved on May 4, 2022]. Retrieved from Internet: <https://www.snia.org/sites/default/files/SDC/2019/presentations/Storage_Architecture/Scriber_Mike_Next-Gen_Performance_&_Efficiency_with_EDSFF_SSD_and_QLC_Technology.pdf>, 18 pages.
<https://www.samtec.com/products/clp-110-02-f-d-be-a-p>, 9 pages, Available at least as early as Feb. 2022, retrieved on May 4, 2022.
<https://www.samtec.com/products/fts-110-04-l-d-p>, 9 pages, Available at least as early as Feb. 2022, retrieved on May 4, 2022.

* cited by examiner

SEMICONDUCTOR DEVICE PACKAGE WITH COUPLED SUBSTRATES

BACKGROUND

The present invention generally relates to semiconductor devices and more particularly to semiconductor device packages having two or more substrates directly coupled to one another to reduce complexity of assembly.

Semiconductor device packages often include multiple semiconductor dies and other electrical components coupled to a substrate, such as a printed circuit board (PCB), that is enclosed within an outer housing structure. The dimensions of the semiconductor device packages are often constrained by industry-standard form factors based on the intended use of the semiconductor device packages. Some such form factors may be an Enterprise and Data Center Standard Form Factor (EDSFF), such as the E1.L 9.55 mm form factor or E1.L 18 mm form factor, each of which defines the length, width, and thickness of the package. As the complexity and/or number of electrical components coupled to the substrate increases, the complexity of assembling and time to manufacture also increases. Commonly, a single high-density interconnect (HDI) PCB is used and all of the electrical components are mounted on and coupled thereto; however, the HDI PCB is expensive, complex to manufacture and can be difficult to troubleshoot if a problem is detected. Accordingly, it would be advantageous to have a less complex board design.

BRIEF SUMMARY OF THE INVENTION

In one embodiment there is a semiconductor device package including a first substrate having a top planar surface and a bottom planar surface substantially parallel to the top planar surface, the first substrate extending along a first central plane substantially parallel with the top and bottom planar surfaces and equidistant between the top and bottom planar surfaces. The semiconductor device package further includes a second substrate electrically connected to the first substrate, the second substrate having a top planar surface and a bottom planar surface substantially parallel to the top planar surface, the second substrate extending along a second central plane substantially parallel with the top and bottom planar surfaces of the second substrate and equidistant between the top and bottom planar surfaces, the second central plane being substantially parallel with and offset from the first central plane of the first substrate, and one or more capacitors electrically and mechanically connected to the second substrate via one or more leads. All of the one or more capacitors are positioned at the second substrate.

In some embodiments, the semiconductor device package further includes a housing substantially enclosing the first substrate, the second substrate, and the one or more capacitors, the semiconductor device package having a width, a length, and a thickness defined by an Enterprise and Data Center Standard Form Factor (EDSFF). In some embodiments, the width of the semiconductor device package is about 38.4 millimeters, the length is about 318.75 millimeters, and the thickness defined by a top surface and bottom surface of the housing is about 9.55 millimeters. In some embodiments, each of the one or more capacitors is at least 0.55 millimeters from the top surface and bottom surface of the housing. In some embodiments, the first substrate does not include any capacitors directly coupled to the first substrate.

In some embodiments, each of the one or more capacitors extends circumferentially around a respective capacitor central axis, and each capacitor central axis of each of the one or more capacitors is parallel with and extends between the first central plane of the first substrate and the second central plane of the second substrate. In some embodiments, the second central plane intersects each of the one or more capacitors. In some embodiments, the first substrate has a first length and the second substrate has a second length that is less than the first length. In some embodiments, the first length of the first substrate is twice the second length of the second substrate. In some embodiments, the first substrate has a first thickness and the second substrate has a second thickness that is less than the first thickness. In some embodiments, the first substrate includes a number of layers that is between two to four times greater than a number of layers included in the second substrate.

In another embodiment there is a semiconductor device package including one or more capacitors, a controller and one or more NAND dies, and a first PCB and a second PCB electrically connected to and offset from the first PCB, the second PCB being substantially parallel to the first PCB and extending outwardly therefrom. The controller and the one or more NAND dies are directly coupled to the first PCB and each of the one or more capacitors is directly coupled to the second PCB.

In some embodiments, there are no capacitors directly connected to the first PCB. In some embodiments, the one or more capacitors are the only electrical components directly connected to the second substrate. In some embodiments, the semiconductor device package further includes a housing substantially enclosing the first PCB, second PCB, and the one or more capacitors, the semiconductor device package having a width, a length, and a thickness defined by an Enterprise and Data Center Standard Form Factor (EDSFF). In some embodiments, the width of the semiconductor device package is about 38.4 millimeters, the length is about 318.75 millimeters, and the thickness defined by a top surface and bottom surface of the housing is about 9.55 millimeters. In some embodiments, the first PCB has a length that is about twice the length of the second PCB.

In another embodiment, there is a semiconductor device package including a first substrate means for providing electrical communication to one or more electrical components coupled to the first substrate means, and a second substrate means for providing electrical communication to one or more electrical components coupled to the second substrate means, the second substrate means electrically and mechanically coupled to the first substrate means. The semiconductor device package further includes one or more electrical storage means each for storing an amount of electrical charge, each of the one or more electrical storage means being electrically connected to the second substrate means by a respective electrical connection means. The first and second substrate means are substantially parallel to one another and offset from one another, and all of the one or more electrical storage means are positioned at the second substrate.

In some embodiments, the one or more electrical storage means are the only electrical components directly connected to the second substrate means that are configured to store and electrical charge. In some embodiments the semiconductor device package further includes a housing means for substantially enclosing the first substrate means, the second substrate means, and the one or more electrical storage means, the semiconductor device package having a length, width, and thickness as defined by an Enterprise and Data Center Standard Form Factor (EDSFF).

BRIEF DESCRIPTION OF THE SEVERAL VIEWS OF THE DRAWINGS

The foregoing summary, as well as the following detailed description, will be better understood when read in conjunction with the appended drawings. For the purpose of illustrating the present disclosure, there are shown in the drawings embodiments that are presently preferred wherein like reference numerals indicate like elements throughout. It should be noted, however, that aspects of the present disclosure can be embodied in different forms and thus should not be construed as being limited to the illustrated embodiments set forth herein. The elements illustrated in the accompanying drawings are not necessarily drawn to scale, but rather may have been exaggerated to highlight the important features of the subject matter therein. Furthermore, the drawings may have been simplified by omitting elements that are not necessarily needed for the understanding of the disclosed embodiments.

In the drawings.

DETAILED DESCRIPTION

The present subject matter will now be described more fully hereinafter with reference to the accompanying Figures, in which representative embodiments are shown. The present subject matter can, however, be embodied in different forms and should not be construed as limited to the embodiments set forth herein. Rather, these embodiments are provided to describe and enable one of skill in the art.

Figure 1:
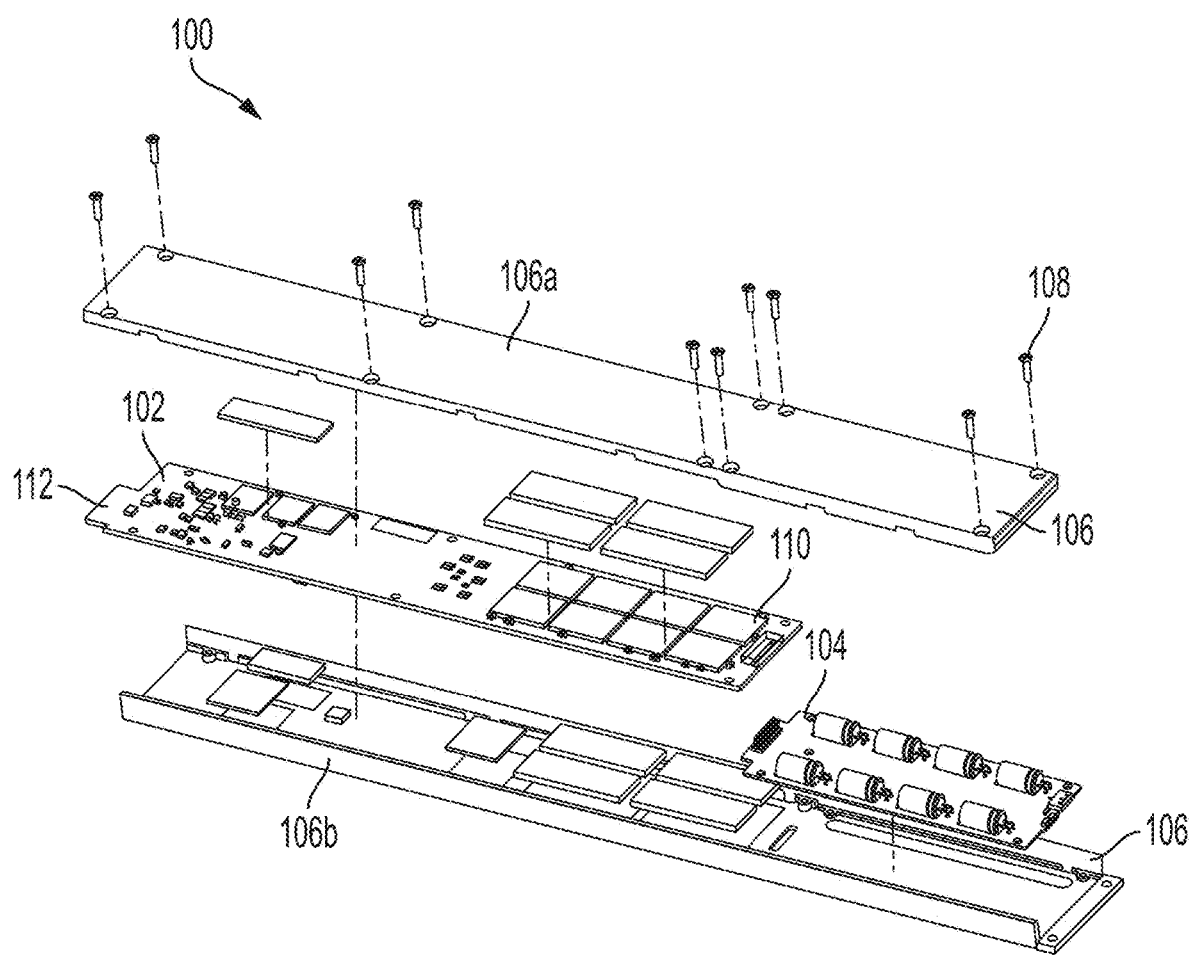
FIG. 1 is an exploded-perspective view of a semiconductor device package in accordance with an exemplary embodiment of the present disclosure.

Referring to FIG. 1, there is shown an exploded-perspective view of a semiconductor device package, generally designated 100, in accordance with an exemplary embodiment of the present disclosure. The semiconductor device package 100 may include a first substrate 102 and a second substrate 104 substantially enclosed within a housing 106. The first substrate 102 may be for providing storage means, processing means and/or control means, and the second substrate 104 may be for providing capacitance means. The housing 106 may be configured to protect the first and second substrates 102, 104, and any components directly connected thereto, from external forces and to keep debris from entering into the housing 106. In some embodiments, the housing 106 is comprised of one or more of a polymer, metal, plastic, and/or a composite material. The housing 106 may include a top plate 106a and a bottom plate 106b configured to be fixedly coupled to one another via one or more fasteners 108 (e.g., screws). The fasteners 108 may fixedly couple the first and second substrates 102, 104 to the housing 106. For example, each of the first and second substrates 102, 104 may include one or more apertures sized to receive the fasteners 108. The housing 106 may substantially enclose the first and second substrates 102, 104 while allowing for the first substrate 102 and/or second substrate 104 to be electrically connected to one or more external devices.

Figure 2:
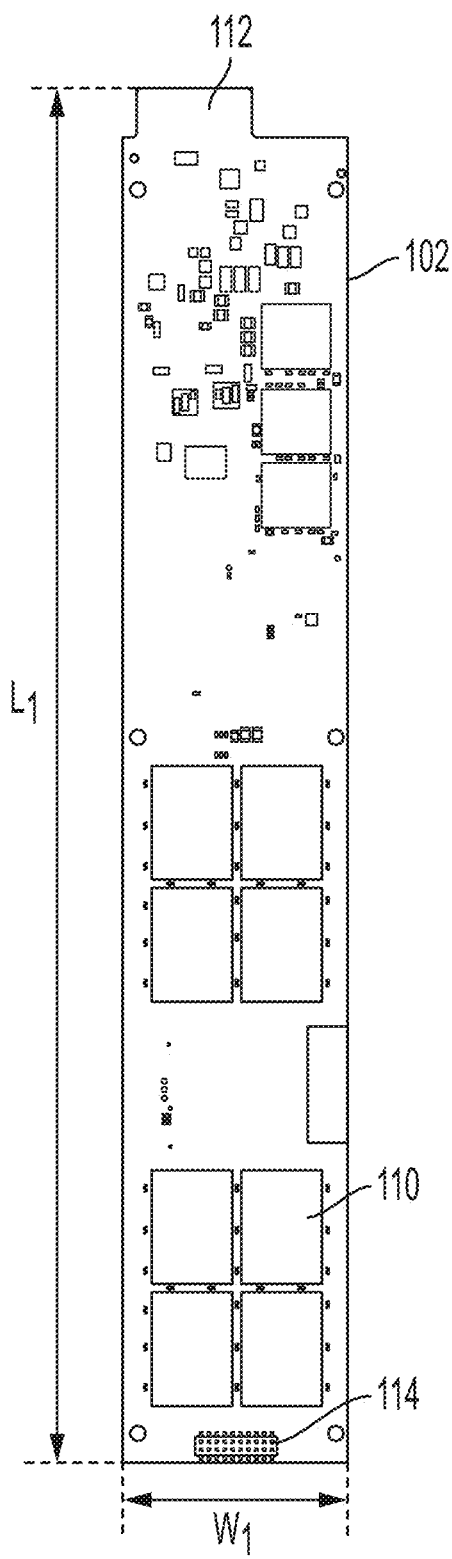
FIG. 2 is a top elevational view of a first substrate of the semiconductor device package of FIG. 1.

Referring to FIGS. 1-2, the first substrate 102 may be a mechanical base support for the electrical components connected thereto and an electrical interface (or electrical circuit) that provides access to said electrical components. In some embodiments, the first substrate 102 may include an electrical circuit (not shown) having a plurality of metal layers and/or traces disposed within the first substrate 102, including one or more layers for routing signals such as, but not limited to, input/output signals, power signals, and ground signals using conductive (e.g., copper) traces. In some embodiments, the first substrate 102 includes up to sixteen layers for routing signals. In some embodiments, the first substrate 102 is a first printed circuit board (PCB). In some embodiments, the first substrate is a high-density interconnect (HDI) PCB.

The first substrate 102 may include one or more semiconductor dies 110 electrically connected thereto. The semiconductor dies 110 electrically connected to the first substrate 102 may be any type of semiconductor dies, such as, but not limited to, memory dies (e.g., NAND dies), application specific integrated circuit (ASIC) dies, controller dies, or other integrated circuit (IC) dies. For example, in some embodiments, there is at least one controller and one or more NAND dies directly coupled to the first substrate 102. In some embodiments, there is a plurality of semiconductor dies 110 electrically connected to the first substrate 102, one or more of which being a different type of semiconductor die than one or more other semiconductor dies. For example, the semiconductor dies may include a plurality of memory dies and one or more control dies electrically connected to the first substrate 102. The semiconductor dies 110 may be directly connected to the first substrate 102 via any conventional methods (e.g., wire bond, flip-chip mounting) known to those skilled in the art.

Although the semiconductor dies 110 may not be limited to the types of dies described above, the semiconductor dies 110 directly connected to the first substrate 102 may not include any capacitors. Put another way, in some embodiments there are no capacitors directly connected to the first substrate 102. In some embodiments, there may be multiple semiconductor dies 110 and/or other semiconductor devices that are directly mounted on and electrically connected to the substrate 102, none of which may be capacitors. As such, the semiconductor dies 110 may not include any capacitors.

In some embodiments, the first substrate 102 includes an external device interface 112 configured to electrically connect the semiconductor device package 100 to an external device (e.g., a server, database). In some embodiments, the external device interface 112 is integrally formed with the first substrate 102. The external device interface 112 may include one or more electrical communication pathways and may be dimensioned based on an existing industry-standard form factor. In some embodiments, when the first substrate 102 is substantially enclosed within and coupled to the housing 106, the external device interface 112 may protrude from the housing 106 such that it is not enclosed within the housing 106. In this manner, the external device interface 112 may allow the semiconductor device package 100 to be electrically connected to an external device.

The first substrate 102 may have a length $L_1$ as measured from a peripheral end of the external device interface 112 to a peripheral end of the first substrate 102 opposite the external device interface 112. In some embodiments, the length $L_1$ may be less than an industry-standard form factor for semiconductor device packages. For example, the Enterprise and Data Center Standard Form Factor (EDSFF) includes multiple form factors that define the overall length, width, and thickness of semiconductor device packages. One such form factor, the E1.L 9.55 mm form factor, defines the length of a semiconductor device package as 318.75 millimeters. The length $L_1$ may be less than or equal to two-thirds of the length defined by said form factor (e.g., 318.75 mm). In some embodiments, the length $L_1$ of the first substrate 102 is less than or equal to 212.5 mm. The first substrate 102 may also have a width $W_1$ that is less than the width of a semiconductor device package defined by an EDSFF form factor but that is greater than two-thirds of said form factor width.

In some embodiments, there is a first connector 114 coupled to the first substrate 102 and configured to couple the second substrate 104 to the first substrate 102. The first connector 114 may be positioned opposite the external device connector 112. In some embodiments, the first connector 114 is positioned at or proximate to a peripheral edge of the first substrate 102. The first connector 114 may be electrically and mechanically connected to the first substrate 102. In some embodiments, the first connector 114 is configured to mechanically and electrically connect the first substrate 102 and the second substrate 104. In some embodiments, the first connector 114 is one-half of a pin-and-socket connector. For example, the first connector 114 may be a socket connector including one or more sockets configured to receive the pins of a corresponding pin connector.

Figure 3:
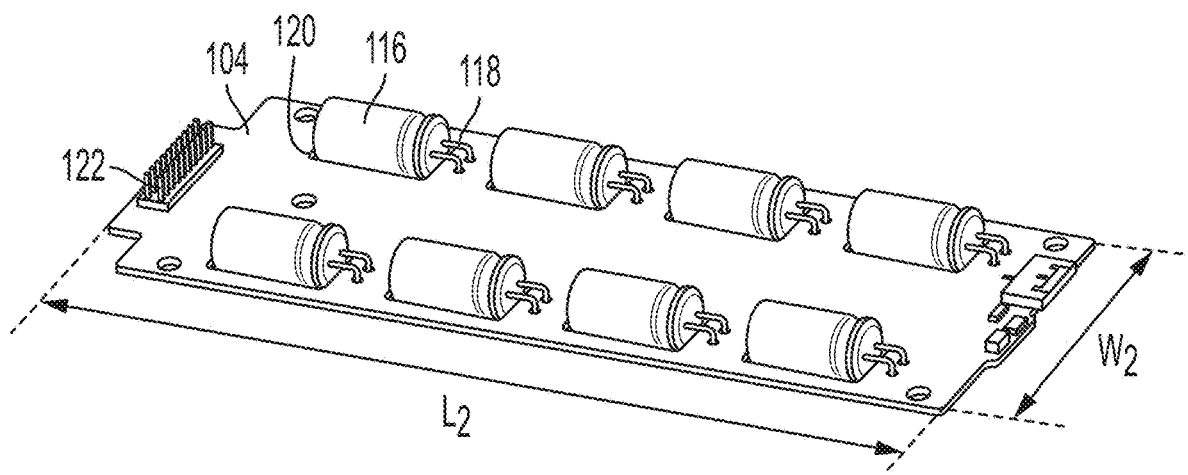
FIG. 3 is a perspective view of a second substrate of the semiconductor device package of FIG. 1.

Referring to FIGS. 1 and 3, the second substrate 104 may be a mechanical base support for the electrical components connected thereto and an electrical interface (or electrical circuit) that provides access to said electrical components. In some embodiments, the second substrate 104 may include an electrical circuit (not shown) having a plurality of metal layers and/or traces disposed within the second substrate 104, including one or more layers for routing signals such as, but not limited to, input/output signals, power signals, and ground signals using conductive (e.g., copper) traces. In some embodiments, the second substrate 104 includes fewer metal layer and/or traces than the first substrate 102. In some embodiments, the second substrate 104 includes about four layers for routing signals. In some embodiments, the first substrate 102 may include a number of layers that is between two to four times greater than the number of layers included in the second substrate 104. In some embodiments, the second substrate 104 is a second printed circuit board (PCB). In some embodiments, the second substrate 104 may not be an HDI PCB. As such, advantages of having the second substrate 104 are that it may be lower cost, less complex and/or less time-consuming to manufacture than the first substrate 102.

The second substrate 104 may include one or more capacitors 116 coupled thereto, each of which is configured to store an electrical charge. In some embodiments, there are more than two capacitors 116 directly connected to the second substrate 104. For example, as shown in FIG. 3, there are eight capacitors 116 directly connected to the second substrate 104. None of the capacitors 116 may be directly connected to the first substrate 102 and, similarly, none of the semiconductor dies 110 may be directly connected to the second substrate 104. In some embodiments, there may be one or more other electrical components directly connected to the second substrate; however, the only electrical component directly connected to the second substrate 104 that is configured to store an electrical charge may be the capacitors 116. For example, the capacitors 116 may be the only electrical components directly connected to the second substrate 102 that store electrical energy in an electric field. In some embodiments, the capacitors 116 are the only electrical component directly connected to the second substrate 104 that is configured to provide a capacitance means. In some embodiments, there are no electrical components that include one or more floating-gate transistors directly connected to the second substrate 104.

In some embodiments, because each of the capacitors 116 included in the semiconductor device package 100 is directly connected to the second substrate 104 and is not directly connected to the first substrate 102, the capacitors 116 may generally have a lower temperature rating than capacitors included in conventional semiconductor device packages. The temperature rating of the capacitors may refer to a maximum temperature that the capacitor may be at without there being deformation caused by the temperature. Put another way, the temperature rating is the maximum temperature of the capacitor, above which deformations may occur due to leaking and/or high internal pressure, each caused by the capacitor being above the maximum temperature. In conventional semiconductor device packages, a single substrate is used to electrically connect semiconductor dies, capacitors, and other electrical components. Said substrates typically undergo a reflow soldering process, or another conventional soldering means, to electrically connect the semiconductor dies and other electrical components to the substrate. However, all components, including the capacitors, are typically coupled to the substrate prior to the reflow soldering process. As such, the capacitors much have a temperature rating high enough to withstand the temperatures reached during reflow soldering. Furthermore, the substrate of conventional packages may also undergo additional reworking and/or assembly processes that expose the substrate and all the components connected thereto to high temperatures.

However, in the semiconductor device package 100 of the present disclosure, the first substrate 102 and second substrate 104 are detachably coupled to one another. In this manner, the first substrate 102 may undergo a reflow soldering process to electrically and mechanically couple the semiconductor dies 110 to the first substrate 102 without the second substrate 104 being coupled thereto. As such, the capacitors 116 connected to the second substrate 104 may not require a temperature rating high enough to withstand reflow soldering. Put another way, the first substrate 102 may be decoupled from the second substrate 104 during assembly of the semiconductor device package 100 such that the first substrate 102, and the components directly connected thereto, may be worked on separate from the second substrate 104 and the capacitors 116. In some embodiments, each of the capacitors 116 is an electrolytic capacitor. In some embodiments, each capacitor has a temperature rating of about 135 degrees Celsius.

Each capacitor 116 may be electrically connected to the second substrate 104 via one or more leads 118. The leads 118 may be electrically connected to a capacitor 116 at a first end of the lead 118 and the second substrate 104 at a second end of the lead 118 opposite the first end.

In some embodiments, the second substrate 104 includes one or more capacitor apertures 120 that extend through the thickness of the second substrate 104. The capacitor apertures 120 may each allow a portion of a corresponding capacitor 116 to pass therethrough such that a portion of the capacitor 116 is above the second substrate 104 and another portion is below the second substrate 104. In some embodiments, the capacitor apertures 120 have a width that is less than a diameter of the capacitors 116 to prevent the capacitors from being able to pass entirely through the capacitor apertures 120.

In some embodiments, the second substrate 104 has a length $L_2$ and a width $W_2$. In some embodiments, the length $L_2$ of the second substrate 104 may be less than an industry-standard form factor, such as, but not limited to, EDSFF. For example, and as discussed above, the E1.L 9.55 mm form factor requires that the length of a semiconductor device package be 318.75 mm. The length $L_2$ of the second substrate 104 may be less than one-third of said industry-standard form factor length. For example, the length $L_2$ of the second substrate 104 may be less than 106.25 mm. In some embodiments, the length $L_2$ may be about one-half of the length $L_1$ of the first substrate 102 or, put another way, the length $L_1$ may be about twice the length $L_2$. In some embodiments, the width $W_2$ of the second substrate 104 may be generally equal to the width $W_1$ of the first substrate 102.

Although the capacitors 116 may be the only electrical components directly connected to the second substrate 104 that are configured to store an electrical charge, there may be one or more other electrical components directly connected to the second substrate 104. In some embodiments, there may be a second connector 122 directly connected to the second substrate 104. The second connector 122 may be mechanically and electrically connected to the second substrate 104 such that electrical signals may be transmitted through the second connector 122 to the electrical circuit of the second substrate 104. In some embodiments, the second connector 122 is one-half of a pin-and-socket connector. For example, the second connector 122 may be a pin connector including one or more pins protruding therefrom and configured to be received within a corresponding socket connector. In some embodiments, the second connector 122 is configured to electrically connect the second substrate 104 to the first substrate 102.

Figure 4A:
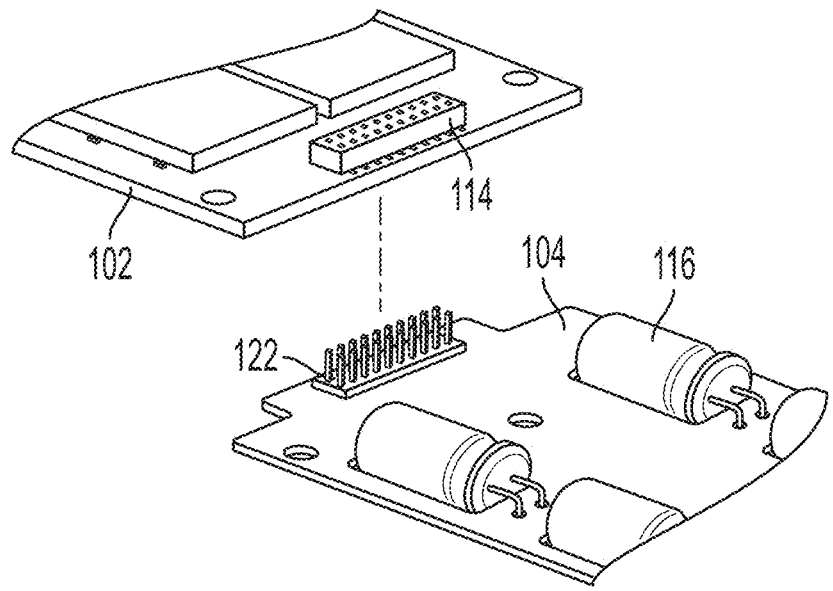
FIGS. 4A-4B are magnified views illustrating coupling the first and second substrates of the semiconductor device package of FIG. 1 to one another.
Figure 4B:
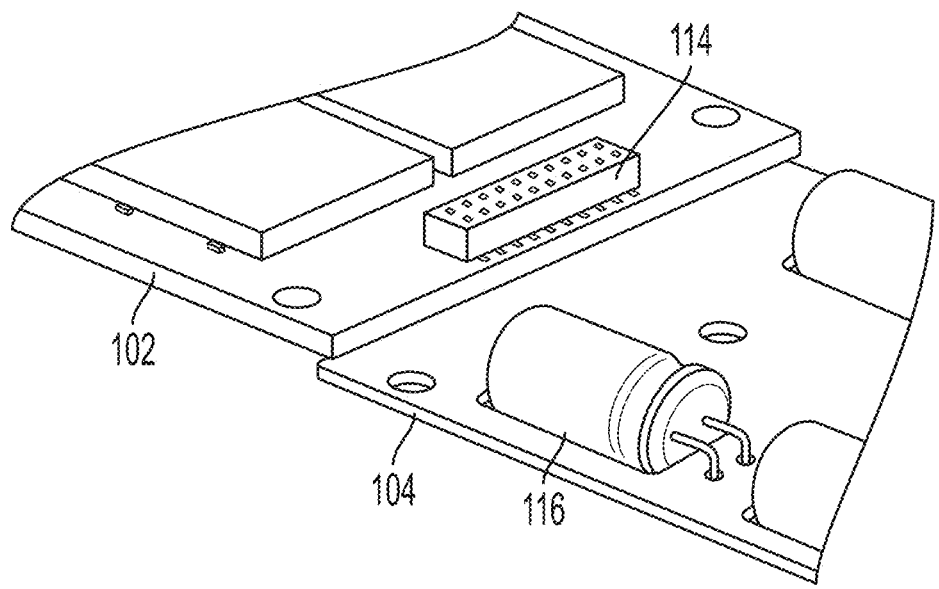

Referring to FIGS. 4A-4B, there is shown an illustration of coupling the first substrate 102 to the second substrate 104. In some embodiments, the first substrate 102 and second substrate 104 may be coupled to one another via the first connector 114 and second connector 122. For example, the first connector 114 may be configured to receive a portion of the second connector 122 such that the first connector 114 and second connector 122 are mechanically and electrically connected. In some embodiments, coupling the first substrate 102 to the second substrate 104 includes positioning the first connector 114 above the second connector 122 (as shown in FIG. 4A) such that the first connector 114 and second connector 122 are aligned. The first connector 114 may be directly connected to the second connector 122 (as shown in FIG. 4B) such that the first substrate 102 and second substrate 104 are coupled to one another. In this manner, the first connector 114 and second connector 122 may couple the first and second substrates 102, 104 to one another. In some embodiments, the first and second connectors 114, 122, when connected to each other, may allow electrical signals to be transmitted between the first and second substrates 102, 104 and the components connected thereto. Although the first connector 114 is depicted as a socket connector and the second connector 122 is depicted as a pin connector, in some embodiments the first connector 114 is the pin connector and the second connector 122 is the socket connector.

Figure 5:
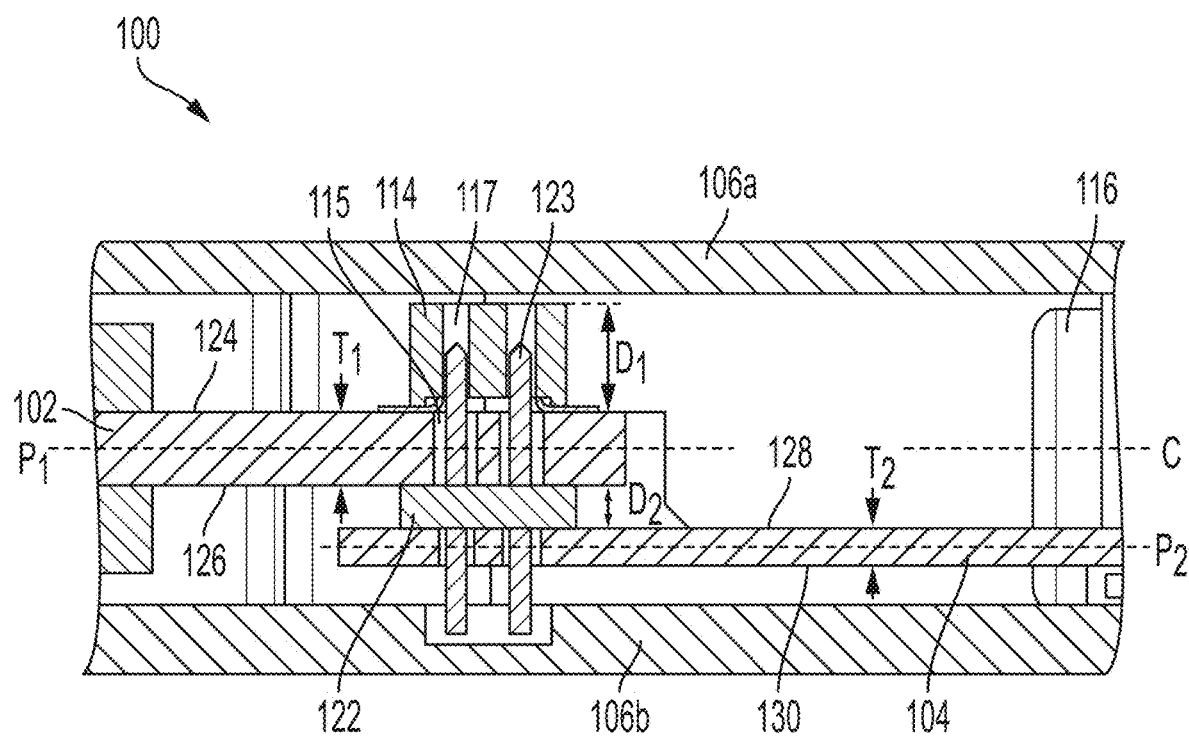
FIG. 5 is a magnified cross-sectional side view of the semiconductor device package of FIG. 1.

Referring to FIG. 5, there is shown a cross-sectional magnified side view of the semiconductor device package 100. The second substrate 104 may be offset from the first substrate 102 when the first and second substrates 102, 104 are coupled to one another. The first substrate 102 may include a top planar surface 124 and a bottom planar surface 126 that is opposite to and substantially parallel with the top planar surface 124. The first substrate 102 may extend along a first central plane $P_1$ that is substantially parallel with the top and bottom planar surfaces 124, 126. In some embodiments, the first central plane $P_1$ is equidistant between the top and bottom planar surfaces 124, 126. The semiconductor dies 110 (shown in FIGS. 1-2) may be coupled to the top planar surface 124, the bottom planar surface 126, or a combination thereof. In some embodiments, the first connector 114 is coupled to the top planar surface 124 of the first substrate 102. The first connector 114 may protrude upwardly from the top planar surface 124 by a distance $D_1$. In some embodiments, the distance $D_1$ is about 2.29 mm.

The first substrate 102 may have a thickness $T_1$ as measured by the distance between the top and bottom planar surfaces 124, 126 in a direction that is perpendicular to both. The thickness $T_1$ of the first substrate 102 may be between about 0.40 mm to about 3.2 mm. In some embodiments, the thickness $T_1$ is about 1.57 mm. In some embodiments, there are one or more apertures 115 extending through the thickness $T_1$ of the first substrate 102 proximate to the first connector 114. The one or more apertures 115 may be sized to allow the second connector 122 to extend therethrough such that an electrical connection between the first and second connectors 114, 122 may be established. In some embodiments, the first connector 114 is mounted on the top planar surface 124 of the first substrate 102 and positioned such that one or more openings 117 in the first connector 114 are aligned with the one or more apertures 115. The openings 117 may be configured to receive one or more of the pins 123 included in the second connector 122. The one or more pins 123 are comprised of an electrically conductive material (e.g., copper) for electrically coupling the second connector 122 to the first connector 114. For example, the pins 123, when received within the one or more openings 117, may be in electrical communication with the first connector 114 via the openings 117. In this manner, the pins 123 may extend through the apertures 115 in the first substrate 102 and be received within the one or more openings 117 defined by the first connector 114 such that the first and second connectors 114, 122 are electrically connected.

The second substrate 104 may include a top planar surface 128 and a bottom planar surface 130 that is opposite to and substantially parallel with the top planar surface 128. In some embodiments, the second connector 122 is coupled to and extends upwardly from the top planar surface 128 of the second substrate 104. In some embodiments, when the second substrate 104 is coupled to the first substrate 102, the top planar surface 128 of the second substrate 104 may be substantially parallel with and offset from the top planar surface 124 of the first substrate 102. In some embodiments, when the first substrate 102 and second substrate 104 are coupled to one another, the top planar surface 128 of the second substrate 104 is positioned below the bottom planar surface 126 of the first substrate 102. A portion of the second connector 122 may space the bottom planar surface 126 of the first substrate 102 from the top planar surface 128 of the second substrate 104 by a distance $D_2$. For example, a portion of the second connector 122 may be positioned between the first substrate 102 and second substrate 104 when the second connector 122 is electrically coupled to the first connector 114. In some embodiments, a portion of the second connector 122 may abut the bottom planar surface 126 of the first substrate 102 and the top planar surface 128 of the second substrate 104. In some embodiments, the distance $D_2$ is about 0.86 mm.

The second substrate 104 may have a thickness $T_2$ that is measured as the distance between the top and bottom planar surfaces 128, 130 in a direction that is perpendicular to both. The thickness $T_2$ of the second substrate 104 may be less than the thickness $T_1$ of the first substrate 102. For example, the thickness $T_2$ of the second substrate may be between about one-fourth to one-half of the thickness $T_1$ of the first substrate 102.

The second substrate 104 may extend along a second central plane $P_2$. The second central plane $P_2$ may be substantially parallel with the top and bottom planar surfaces 128, 130 of the second substrate 104. In some embodiments, the second central plane $P_2$ is equidistant between the top planar surface 128 and bottom planar surface 130 of the second substrate 104. In some embodiments, the second central plane $P_2$ is offset from the first central plane $P_1$. For example, the second central plane $P_2$ may be positioned below the first central plane $P_1$. The second central plane $P_2$ may be offset from the first central plane $P_1$ by an amount equal to one-half the thickness $T_1$ plus the distance $D_2$ plus one-half the thickness $T_2$. The second central plane $P_2$ may be substantially parallel with the first central plane $P_1$. In this manner, the first central plane $P_1$ and second central plane $P_2$ may not intersect one another.

Figure 6A:
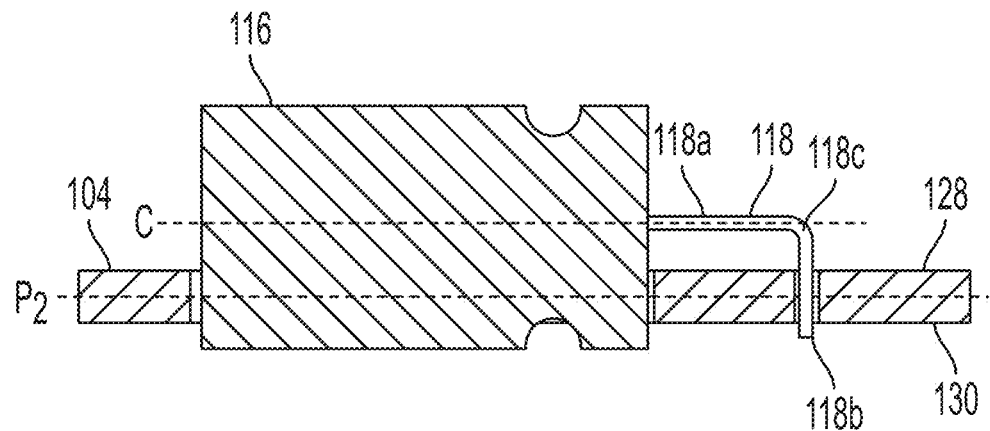
FIG. 6A is a magnified cross-sectional view of the second substrate of the semiconductor device package of FIG. 1 with a capacitor connected thereto.

Referring to FIGS. 5-6A, each of the capacitors 116 directly connected to the second substrate 104 may extend circumferentially around a capacitor central axis C. In some embodiments, the capacitor central axis C is parallel with the first central plane $P_1$ and/or the second central plane $P_2$. The capacitor central axis C may be positioned between the first central plane $P_1$ and the second central plane $P_2$. In some embodiments, the capacitor central axis C is aligned with the first central plane $P_1$, or, put another way, is parallel with and intersects the first central plane $P_1$. In some embodiments, the second central plane $P_2$ intersects each of the capacitors 116. In some embodiments, each of the capacitors has a diameter of about 6.30 mm.

In some embodiments, the leads 118 that electrically connect the capacitors 116 to the second substrate 104 are L-shaped leads. For example, each lead 118 may be comprised of a first portion 118a and a second portion 118b connected to one another at a bend 118c. The first portion 118a may extend in a direction that is parallel with the capacitor central axis C. In some embodiments, the first portion 118a is offset from the capacitor central axis C. The second portion 118b may extend in a direction that is generally perpendicular to the capacitor central axis C. The bend 118c may extend between the first portion 118a and the second portion 118b such that the first and second portions 118a, 118b are integrally formed. In some embodiments, the bend 118c is the only bend in the lead 118. In this manner, the leads 118 may be generally L-shaped or, put another way, may be L-bend leads. In some embodiments, no portion of the leads 118 extends above the first portion 118a. The L-shaped leads 118 may provide manufacturing benefits, such as, but not limited to, reductions in production time and complexity when compared to other types of leads that include more complex geometries such as, for example, hook-shaped leads that include multiple bends in the lead.

Figure 6B:
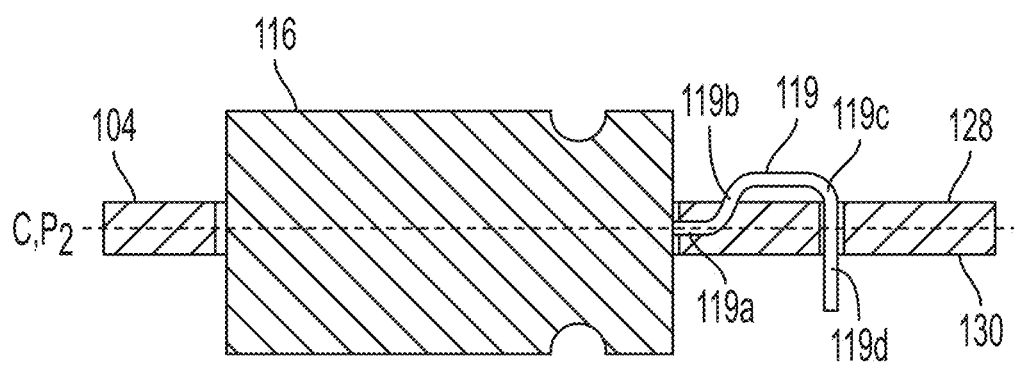
FIG. 6B is a magnified cross-sectional view of the second substrate of the semiconductor device package of FIG. 1 with a capacitor having a modified lead connected to the second substrate.

Referring to FIG. 6B, in some embodiments, the capacitor 116 may be generally centered between the top and bottom planar surfaces 128, 130 of the second substrate. For example, the capacitor central axis C may be aligned with the second central plane $P_2$ of the second substrate 104, or put another way, the capacitor central axis C may be parallel with and intersect the second central plane $P_2$. In some embodiments, a lead 119, having a shape that is different from the lead 118 shown in FIG. 6A, is used to electrically connect the capacitor 116 to the second substrate 104 such that the capacitor central axis C and second central plane $P_2$ are aligned with one another. In some embodiments, the lead 119 is a hook-shaped lead having more than one bend along the length of the lead 119. For example, the lead 119 may have a first section 119a that extends outwardly from the capacitor 116 and is parallel with the capacitor central axis C. There may be a second section 119b that extends upwardly from the first section 119a at an oblique angle. There may be a third section 119c that extends outwardly from the second section 119b away from the capacitor 116 and generally parallel to the capacitor central axis C. There may be a fourth section 119d that extends downwardly at a generally right angle from the third section 119c towards the second substrate 104. As such, there may be three bends included in the lead 119. For example, there is a first bend between the first and second sections 119a, 119b, a second bend between the second and third sections 119b, 119c, and a third bend between the third and fourth sections 119c, 119d. In some embodiments, by positioning the capacitor 116 to be generally centered between the top and bottom planar surfaces 128, 130 of the second substrate 104, the capacitor 116 may be centered between top and bottom surfaces of an enclosure and/or housing that the second substrate 104 is enclosed within.

Figure 7:
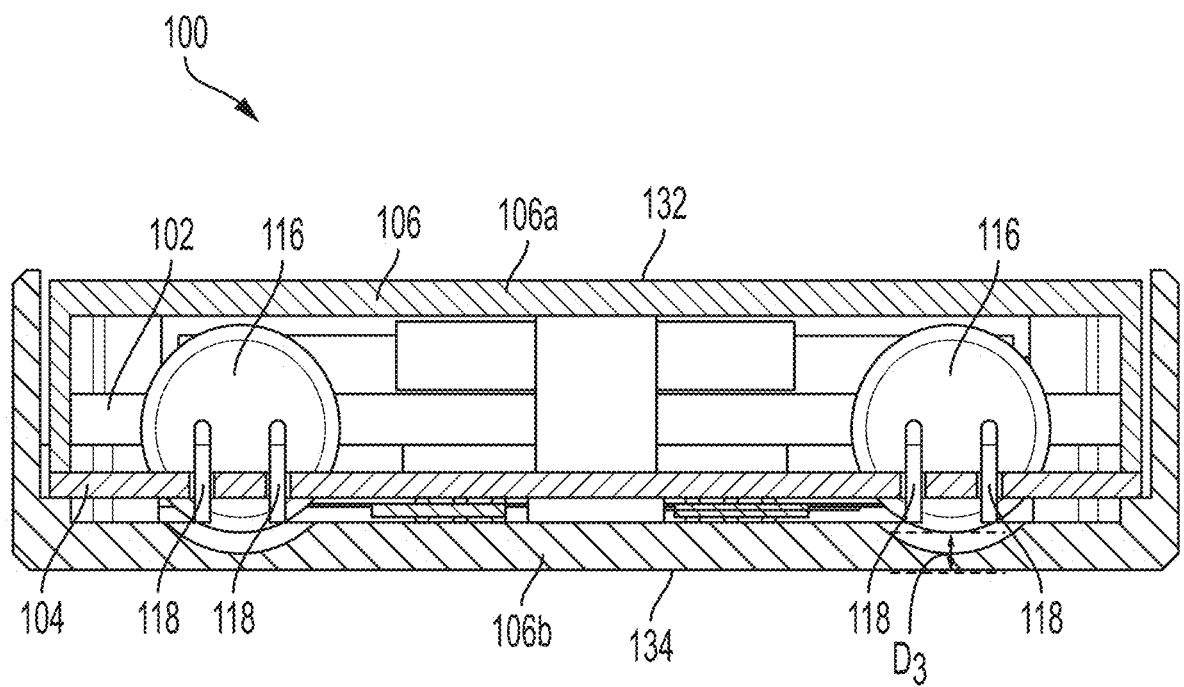
FIG. 7 is a magnified front elevational view of the semiconductor device package of FIG. 1.

Referring to FIG. 7, there is shown a cross-sectional front view of the semiconductor device package 100. Each capacitor 116 may be spaced from an outer surface of the housing 106 by a minimum distance $D_3$. For example, the housing 106, comprised of a top plate 106a and bottom plate 106b, may include a top surface 132 and a bottom surface 134. The minimum distance $D_3$ from a bottom edge of each capacitor 116 to the bottom surface 134 of the housing 106 may be at least 0.55 mm. In some embodiments, the minimum distance from the top edge of each capacitor to the top surface 132 of the housing 106 may be generally equal to $D_3$.

Figure 8:
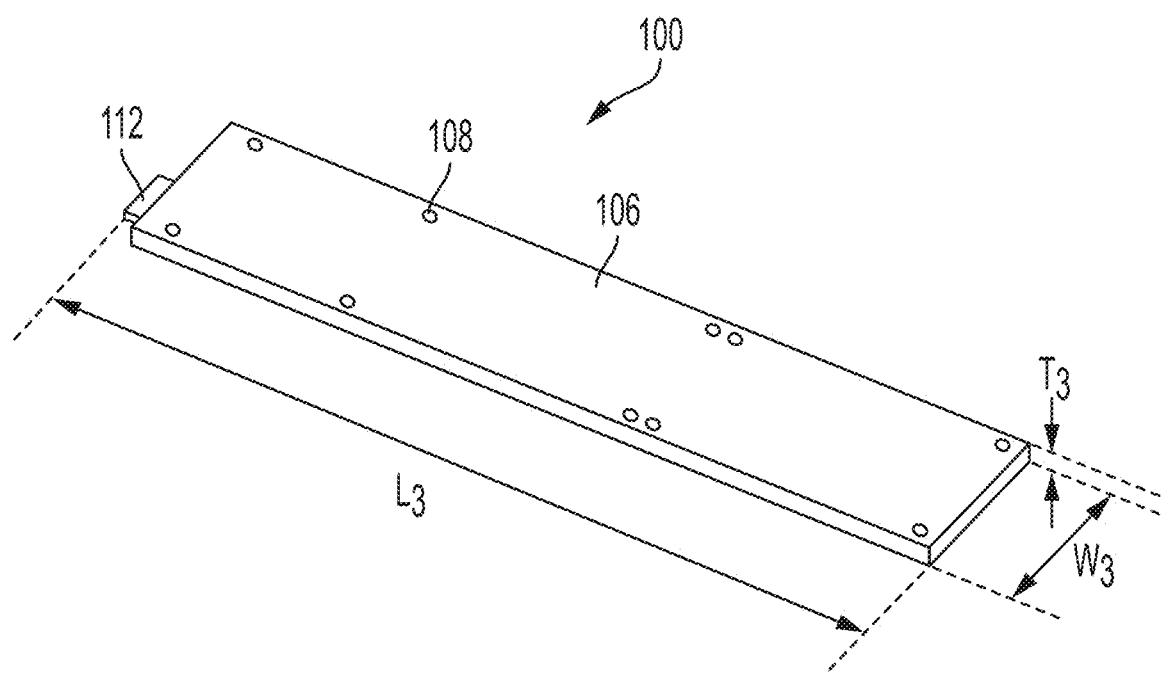
FIG. 8 is a perspective view of the semiconductor device package of FIG. 1 assembled.

Referring to FIG. 8, there is illustrated a perspective view of the semiconductor device package 100 fully assembled. The semiconductor device package 100 may have a length $L_3$, a width $W_3$ and a thickness $T_3$. In some embodiments, the length $L_3$, width $W_3$ and thickness $T_3$ are defined by EDSFF standards. For example, the length $L_3$ may be about 318.75 mm, the width $W_3$ may be about 38.4 mm and the thickness $T_3$ may be about 9.55 mm as defined by the E1.L 9.55 mm standard. It will be understood, though, that the dimensions of the semiconductor device package may conform to any other industry-standard form factor such as, but not limited to, the E1.L 18 mm form factor or the E1.S form factor.

It will be appreciated by those skilled in the art that changes could be made to the exemplary embodiments shown and described above without departing from the broad inventive concepts thereof. It is understood, therefore, that this invention is not limited to the exemplary embodiments shown and described, but it is intended to cover modifications within the spirit and scope of the present invention as defined by the claims. For example, specific features of the exemplary embodiments may or may not be part of the claimed invention and various features of the disclosed embodiments may be combined. The words "right," "left," "lower" and "upper" designate directions in the drawings to which reference is made. Unless specifically set forth herein, the terms "a," "an" and "the" are not limited to one element but instead should be read as meaning "at least one." As used herein, the term "about" may refer to +/−10% of the value referenced. For example, "about 135" is understood to encompass 121.5 and 148.5.

It is to be understood that at least some of the figures and descriptions of the invention have been simplified to focus on elements that are relevant for a clear understanding of the invention while eliminating, for purposes of clarity, other elements that those of ordinary skill in the art will appreciate may also comprise a portion of the invention. However, because such elements are well known in the art, and because they do not necessarily facilitate a better understanding of the invention, a description of such elements is not provided herein.

Further, to the extent that the methods of the present invention do not rely on the particular order of steps set forth herein, the particular order of the steps should not be construed as limitation on the claims. Any claims directed to the methods of the present invention should not be limited to the performance of their steps in the order written, and one skilled in the art can readily appreciate that the steps may be varied and still remain within the spirit and scope of the present invention.

What is claimed is:

1. A semiconductor device package comprising:
   a first substrate having a top planar surface and a bottom planar surface substantially parallel to the top planar surface, the first substrate extending along a first central plane substantially parallel with the top and bottom planar surfaces and equidistant between the top and bottom planar surfaces;
   a second substrate electrically connected to the first substrate, the second substrate having a top planar surface and a bottom planar surface substantially parallel to the top planar surface, the second substrate extending along a second central plane substantially parallel with the top and bottom planar surfaces of the second substrate and equidistant between the top and bottom planar surfaces, the second central plane being substantially parallel with and offset from the first central plane of the first substrate; and
   one or more capacitors electrically and mechanically connected to the second substrate via one or more leads,
   wherein all of the one or more capacitors are positioned at the second substrate,
   wherein each of the one or more capacitors extends circumferentially around a respective capacitor central axis, and
   wherein each capacitor central axis of each of the one or more capacitors is positioned between the first central plane of the first substrate and the second central plane of the second substrate.

2. The semiconductor device package of claim 1 further comprising:
   a housing substantially enclosing the first substrate, the second substrate, and the one or more capacitors, the semiconductor device package having a width, a length, and a thickness defined by an Enterprise and Data Center Standard Form Factor (EDSFF).

3. The semiconductor device package of claim 2, wherein the width of the semiconductor device package is about 38.4 millimeters, the length is about 318.75 millimeters, and the thickness defined by a top surface and bottom surface of the housing is about 9.55 millimeters.

4. The semiconductor device package of claim 2, wherein each of the one or more capacitors is at least 0.55 millimeters from the top surface and bottom surface of the housing.

5. The semiconductor device package of claim 1, wherein the first substrate does not include any capacitors directly coupled to the first substrate.

6. The semiconductor package of claim 1,
   wherein each capacitor central axis of each of the one or more capacitors is parallel with the first central plane of the first substrate.

7. The semiconductor device package of claim 1, wherein the second central plane intersects each of the one or more capacitors.

8. The semiconductor device package of claim 1, wherein the first substrate has a first length and the second substrate has a second length that is less than the first length.

9. The semiconductor device package of claim 8, wherein the first length of the first substrate is twice the second length of the second substrate.

10. The semiconductor device package of claim 1, wherein the first substrate has a first thickness and the second substrate has a second thickness that is less than the first thickness.

11. The semiconductor device package of claim 1, wherein the first substrate includes a number of layers that is between two to four times greater than a number of layers included in the second substrate.

12. A semiconductor device package comprising:
    one or more capacitors;
    a controller and one or more NAND dies; and
    a first PCB extending along a first central plane that is substantially parallel to and equidistant from a top surface and bottom surface of the first PCB and a second PCB extending along a second central plane that is substantially parallel to and equidistant from a top surface and bottom surface of the second PCB, the second PCB electrically connected to and offset from the first PCB, the second PCB being substantially parallel to the first PCB and extending outwardly therefrom,
    wherein the controller and the one or more NAND dies are directly coupled to the first PCB,
    wherein each of the one or more capacitors is directly coupled to the second PCB,
    wherein each of the one or more capacitors extends circumferentially around a respective capacitor central axis, and
    wherein each capacitor central axis of each of the one or more capacitors is positioned between the first central plane of the first PCB and the second central plane of the second PCB.

13. The semiconductor device package of claim 12, wherein there are no capacitors directly connected to the first PCB.

14. The semiconductor device package of claim 12, wherein the one or more capacitors are the only electrical components directly connected to the second substrate.

15. The semiconductor device package of claim 12 further comprising:
a housing substantially enclosing the first PCB, second PCB, and the one or more capacitors, the semiconductor device package having a width, a length, and a thickness defined by an Enterprise and Data Center Standard Form Factor (EDSFF).

16. The semiconductor device package of claim 15, wherein the width of the semiconductor device package is about 38.4 millimeters, the length is about 318.75 millimeters, and the thickness defined by a top surface and bottom surface of the housing is about 9.55 millimeters.

17. The semiconductor device package of claim 12, wherein the first PCB has a length that is about twice the length of the second PCB.

18. A semiconductor device package comprising:
a first substrate means for providing electrical communication to one or more electrical components coupled to the first substrate means, the first substrate means extending along a first central plane that is substantially parallel with a top planar surface and a bottom planar surface of the first substrate means and the first central plane is equidistant between the top and bottom planar surfaces of the first substrate means;
a second substrate means for providing electrical communication to one or more electrical components coupled to the second substrate means, the second substrate means electrically and mechanically coupled to the first substrate means, the second substrate means extending along a second central plane that is substantially parallel with a top planar surface and a bottom planar surface of the second substrate means and the second central plane is equidistant between the top and bottom planar surfaces of the second substrate means; and
one or more electrical storage means each for storing an amount of electrical charge, each of the one or more electrical storage means being electrically connected to the second substrate means by a respective electrical connection means,
wherein the first and second substrate means are substantially parallel to one another and offset from one another,
wherein all of the one or more electrical storage means are positioned at the second substrate,
wherein each of the one or more electrical storage means extend circumferentially around a respective central axis, and
wherein each central axis of each of the one or more electrical storage means is positioned between the first central plane of the first substrate means and the second central plane of the second substrate means.

19. The semiconductor device package of claim 18, wherein the one or more electrical storage means are the only electrical components directly connected to the second substrate means that are configured to store and electrical charge.

20. The semiconductor device package of claim 18 further comprising:
a housing means for substantially enclosing the first substrate means, the second substrate means, and the one or more electrical storage means, the semiconductor device package having a length, width, and thickness as defined by an Enterprise and Data Center Standard Form Factor (EDSFF).

* * * * *